United States Patent
Hyväkkä et al.

(10) Patent No.: US 6,301,356 B1
(45) Date of Patent: Oct. 9, 2001

(54) LINE CIRCUIT AND METHOD FOR A LINE CIRCUIT

(75) Inventors: Jouko Hyväkkä, Espoo; Teijo Takala, Karjaa, both of (FI)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 08/938,612

(22) Filed: Sep. 26, 1997

(30) Foreign Application Priority Data

Oct. 2, 1996 (FI) ........................................................ 963939

(51) Int. Cl.[7] ................................................... H04M 7/04
(52) U.S. Cl. ........................................... 379/398; 379/399
(58) Field of Search ................................... 379/398, 399, 379/402, 403, 404

(56) References Cited

U.S. PATENT DOCUMENTS

| | | | |
|---|---|---|---|
| 3,879,675 | 4/1975 | Löfmark | 330/109 |
| 4,456,991 | 6/1984 | Chea, Jr. et al | 370/58 |
| 4,677,667 | * 6/1987 | Burns | 379/398 |
| 5,133,007 | * 7/1992 | Nishimura | 379/398 |
| 5,222,084 | 6/1993 | Takahashi | 370/32.1 |

FOREIGN PATENT DOCUMENTS

| | | | |
|---|---|---|---|
| 2247731 | 4/1973 | (DE) | H03H/11/00 |
| 88/09099 | 11/1988 | (WO) | H04N/1/42 |

* cited by examiner

*Primary Examiner*—Stella Woo
(74) *Attorney, Agent, or Firm*—Burns, Doane, Swecker & Mathis, L.L.P.

(57) ABSTRACT

The invention relates to a line circuit and a method for matching impedance in order to have a certain impedance to a signal path. According to an embodiment said circuit comprises a first line, a second line and a terminating point in said first line. At least one impedance determining circuit is connected between said lines, said at least one impedance circuit further including at least one operational amplifier, at least one multiplexer controllable by a control unit and at least one impedance net. The connection of said at least one impedance circuit is arranged such that an output of the operational amplifier is connected to an inverting input thereof, said impedance net being connected between the output of said amplifier and said terminating point of the line circuit. The arrangement is such that a non-inverting input of the operational amplifier is connectable by at least one respective multiplexer either to the terminating point or to said second line. According to an alternative embodiment said circuit comprises a single line.

23 Claims, 7 Drawing Sheets

11

11

LINE CIRCUIT AND METHOD FOR A LINE CIRCUIT

FIELD OF THE INVENTION

The present invention relates to a line circuit for matching an impedance used in telecommunication equipment, such as fax machines, modems, trunk line units, or in measuring equipment, such as generators thereof, or in measuring devices controlling e.g. the level of power or disturbance. The invention relates further to a method for the same.

BACKGROUND OF THE INVENTION

In analog and digital transmission systems the transmitted voice, sound, data etc. has to be terminated to different impedances. For example, in an analog trunk line unit the input impedance has to be selected e.g. between a resistive and complex impedances. From these the resistive impedance is an ohmic resistance and the complex impedance is a more complicated combination of ohmic resistances and capacitances. Sometimes even inductances form a part of the latter. The numeric values thereof might be such as e.g. 600 $\Omega$(res.) or 220 $\Omega$+(820 $\Omega$//115 nF) (complex), respectively.

The known designs have used straps, mechanical switches or mechanical relays for setting i.e. matching the suitable impedance. Such means need to be turned (switched) on and off manually e.g. by a service man. If the set impedance level is not in the predetermined level an echo effect will exist. In addition, there is always a risk that such mechanical means are switched to a wrong position. This might even happen accidentally after the initial, per se correct settings. From these known means the relays might be software controllable, but the power dissipation, size and lifetime thereof has not proven to be at a acceptable level. The use of so called optorelays is not adequate, as optorelays of good quality are expensive and as the on-state-resistance thereof will affect the termination impedance.

When selecting impedance said on-state-resistance should be zero. On-state-resistance means a unidealality of a switch, i.e. the value of the ohmic resistance over the switch as the switch or relay "draws" i.e. switches. In mechanical relays said value is almost zero, but such relays have various other disadvantages, such as the size, the slow switching speed and overheating problems. Therefore other solutions have been sought, and in many applications said resistance has been accepted to avoid the use of the mechanical relays.

The term 'terminating point' is usually used for a point in which the termination impedance can be seen against the ground. The value of the termination impedance in the terminating point may vary according to the overall system used and the national and international recommendations or requirements in various market areas and countries. For example, a similar termination impedance is not in use in Germany and in USA. In the following the term 'market' is intented to generally mean one such country, market area or similar having an impedance of its own.

For the better understanding of the invention, a brief explanation of the directions in which a signal may move in a terminating point of a signal path is also given herein for three alternative events, i.e. for 1) terminating impedance, 2) output impedance, and for 3) input impedance. In the event of the terminating impedance 1), the signal moves both in and out in the terminating point. This kind of use is common for example in telephone equipments in which the users may listen and speak simultaneously, in fax machines, modems, trunk line units etc. When used as an output impedance 2), the signal moves only out from the terminating point. This kind of use is common, for instance, in generators or measuring devices which generate an output signal (e.g. 1014 Hz, 245 mV) at a given impedance level (e.g. 600 $\Omega$). The third possibility, i.e. input impedance 3), is commonly used e.g. in level meters of measuring devices metering the voltage level of an input signal (power level, disturbance level etc.). In this case the signal moves only to the 'in' direction at the terminating point.

SUMMARY OF THE INVENTION

It is an object of the present invention to overcome the disadvantages of the prior art solutions and to provide a new type of solution for the setting of an impedance.

An object of the present invention is also to provide a method and arrangement in which the same circuitry can be set in accordance with different requirements set by the different markets by means of software based control means.

Another object of the present invention is to provide a method and an arrangement, by means of which the size and the power dissipation of the tele-equipment can be reduced and the reliability thereof can be enhanced.

It is also an object of the present invention to provide a method and an arrangement, by means of which the costs of the tele-equipment (or switch means) can be reduced.

It is also an object of the present invention to provide an arrangement in which the effect of switch tolerances on impedance accuracy can be reduced.

A still further object of the present invention is to provide an arrangement which is suitable for tele-equipment and apparatus.

A still further object of the present invention is to provide an arrangement which is suitable for analog telephone lines having a high number of different, alternative impedances.

Other objects and advantages of the present invention will be brought out in the following part of the specification taken in conjunction with the accompanying drawings.

The objects are obtained by providing a line circuit according to the present invention in order to have a certain impedance to a signal path. According to one alternative embodiment, said circuit comprises a first line and a second (input) line and a terminating point in said first line. At least one impedance determining circuit is connected between said lines. Said impedance circuit includes at least one operational amplifier, at least one multiplexer controllable by a control unit and at least one impedance net. According to the invention, the connection of said impedance circuit is arranged such that an output of the operational amplifier is connected to an inverting input thereof, while said impedance net is connected between the output of said amplifier and said terminating point of the line circuit, the arrangement being such that a non-inverting input of the operational amplifier is connectable by at least one respective multiplexer either to the terminating point or to said second (input) line.

The inventive method comprises the following steps: Connecting said at least one impedance circuit such that an output of the operational amplifier will become connected to an inverting input thereof, connecting the impedance net between the output of said amplifier and said terminating point, and connecting a non-inverting input of said operational amplifier by a respective multiplexer either to said terminating point or to said second line.

According to another embodiment a line circuit for matching impedance in order to have a certain impedance to a signal path is provided, said circuit comprising a line, at least one impedance determining circuit connected to said line, said at least one impedance circuit including at least one operational amplifier and at least one multiplexer controllable by a control unit and at least one impedance net. The connection of said at least one impedance circuit is arranged such that an output of the operational amplifier is connected to an inverting input thereof, said impedance net being connected between the output of said amplifier and said line. The arrangement is such that a non-inverting input of the operational amplifier is connectable by at least one respective multiplexer to said line.

According to the alternative embodiment of the present invention, a method is disclosed for matching impedance in a line circuit in order to have a certain impedance to a signal path. Said circuit comprises a line, at least one impedance determining circuit connected to said line, said at least one impedance circuit including at least one operational amplifier and at least one multiplexer controllable by a control unit and at least one impedance net. The inventive method comprises the steps of connecting said at least one impedance circuit such that an output of the operational amplifier will become connected to an inverting input thereof, connecting the impedance net between the output of said amplifier and said line, connecting a non-inverting input of the operational amplifier by a respective multiplexer to said line.

According to one embodiment a plurality of operational amplifiers are connected to different impedances such that several parallel impedance circuits including an amplifier and an impedance net are provided in a line circuit to form an active load to a voice signal or similar. The amplifiers with their impedances may further be connected parallel to a terminating point such that a signal from the terminating point is adapted to be used when selecting the desired one of the impedances and disconnecting the others, i.e. eliminating the influence of the other impedances. The amplifier may receive said signal from the termination point through a multiplexer used to select the proper impedance and to remove the influence of, i.e disconnect the other impedances. Control means operationally connected to the multiplexer can be used to control the functions of the circuitry.

Several advantages are obtained by means of the present invention. The solution provides a simple, reliable and software controllable manner for the setting of an impedance in various different systems and markets. A precise impedance can be selected by means of a cheap arrangement consisting per se known components. The disadvantageous affects of various "unideal" solutions of different markets can be eliminated. A need for different switching means for different markets is eliminated since the same switching means can be used for various impedances.

In the following the invention and the other objects and advantages thereof will be described by way of an example with reference to the annexed drawings, in which similar reference characters throughout the various figures refer to similar features. It should be understood that the following description of examples of the invention is not meant to restrict the invention to the specific forms presented in this connection but rather the present invention is meant to cover all modifications, similarities and alternatives which are included in the spirit and scope of the present invention, as defined by the appended claims.

DETAILED DESCRIPTION OF THE DRAWINGS

Figure 1:
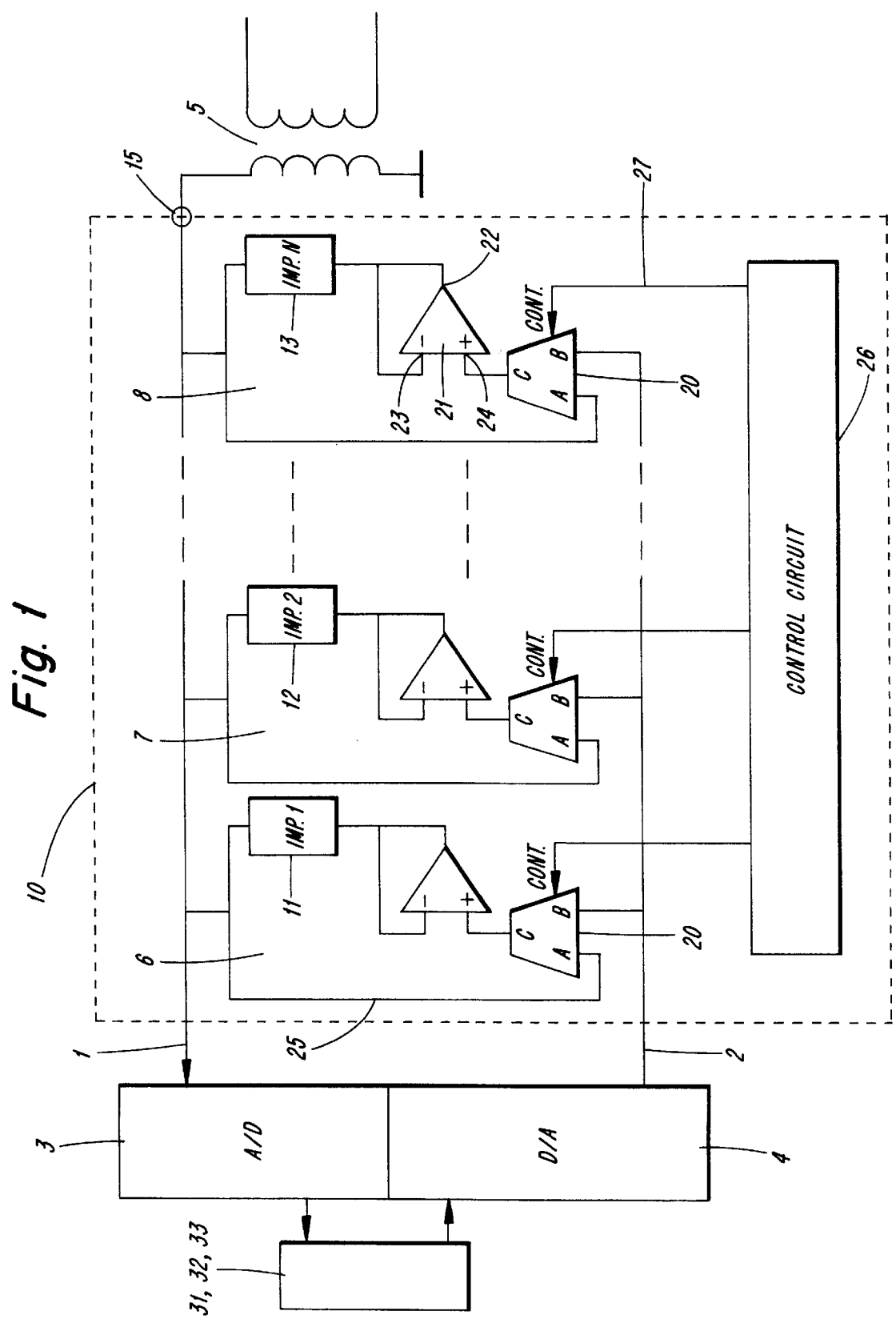
FIG. 1 is a schematic presentation of one preferred embodiment according to the present invention.

FIG. 1 discloses a schematic presentation of a circuitry or switching means 10 connected between lines 1 and 2 of a line circuit according to one preferred embodiment of the present invention. Converting means 3 and 4 for the analog to digital (A/D) and digital to analog (D/A) conversions, respectively, are connected on the lines 1 and 2, respectively, between the switching means 10 and appropriate telecommunication devices, such as fax machines 31, modems 32, digital exchange systems 33 etc. Termination means 5 connected to the switching means 10 by means of the line 1 are also shown on the right hand side of FIG. 1.

The switching means 10 include a plurality of impedance circuits 6, 7, 8 parallel connected to said lines between termination means 5 and converting means 3 and 4. Said line 1 is a two-way (or both-way) line in which a signal from a terminating point 15 moves in both directions. The line 2 functions as an input line for the several impedance circuits. The number of the impedance circuits can be freely chosen according to the overall design requirements set for the complete system in question, and thus the number of impedance circuits in FIG. 1 is shown to be N. One line circuit 10 can, for example, include suitable impedance circuits for 10 different markets.

Each of said impedance circuits 6 to 8 consists a multiplexer 20, an operational amplifier 21 and an impedance net 11, 12, 13, respectively. The multiplexers and amplifiers of each circuit may be of essentially similar design. The multiplexer 20 may, for example, be of a type of an analog switch, which are per se known. To give an example of a suitable multiplexer, those marked with a code 74HC4053 could be used in here. The operational amplifier could be such as LMC660 sold by National Semiconductor, but it should be noted that this is only an example and other types of amplifiers could be used as well. The multiplexers 20 are controlled by control means 26 through an operational connection 27. Said control means 26 can consist of per se known programmable controls, such as microprocessors comprising central processing unit (CPU), memory means and I/O means (input/output means).

Figure 2A:
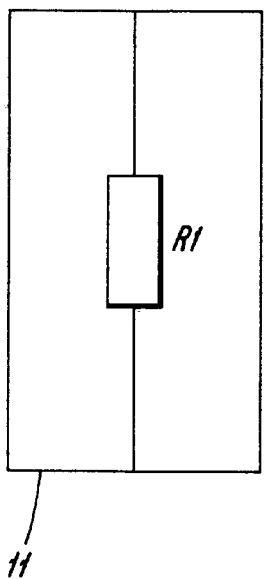
FIGS. 2a and 2b are schematic views of possible impedance nets.

The value of the impedance of each impedance circuit 6 to 9 is defined by said impedance nets 11 to 13 (see FIGS. 2a and b). A termination impedance is defined in the terminating point 15 and a signal including this value is led into each of circuits 6 to 9, wherein the multiplexers 20 are used to select a proper impedance (i.e. proper impedance net) and to disconnect the others. A wire 25 provides an feedback circuitry in case the impedance circuitry is disconnected.

In FIG. 1 impedance 11 corresponding to the termination impedance 15 is selected to be "open" (B-C connected) by the multiplexer of circuit 6 and the others, i.e. circuits 7 and 8, are "closed" (A-C connected in the respective multiplexers). These "closed" impedance circuits 7 and 8 are in a feedback connection to the termination means 5, and therefore do not have any effect on to the impedance of the operational amplifier 21 of the impedance circuit 6 in use.

An output 22 of each operational amplifier 21 is connected to an inverting input 23 thereof, each impedance net 11–14 being connected between the output of the respective amplifier 21 and said terminating point 15.

The arrangement is therefore such that one of the multiplexers 20 provides the connection between said second line or input line 2 and a non-inverting input 24 of said operational amplifier 21 while the other multiplexers 20 provide a connection between said termination point 15 and said non-inverting input 24 of said operational amplifier 21.

Figure 2B:
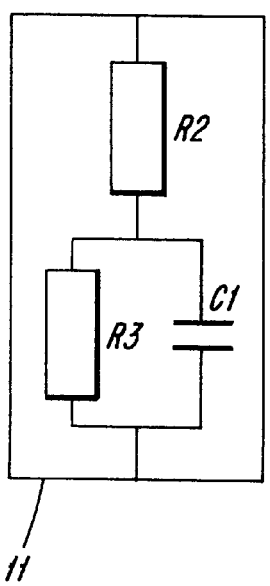

FIGS. 2a and b show, as an example only, two possibilities for impedance nets 11. The impedance net of FIG. 2a includes only a single ohmic resistor R1, which is well known to the skilled person. The impedance net of FIG. 2b consists of two resistors R2 and R3 and a capacitor C1, the arrangement being such that the resistor R3 and capacitor C1 form a parallel subcircuit which in turn is in line with resistor R2.

Figure 3:
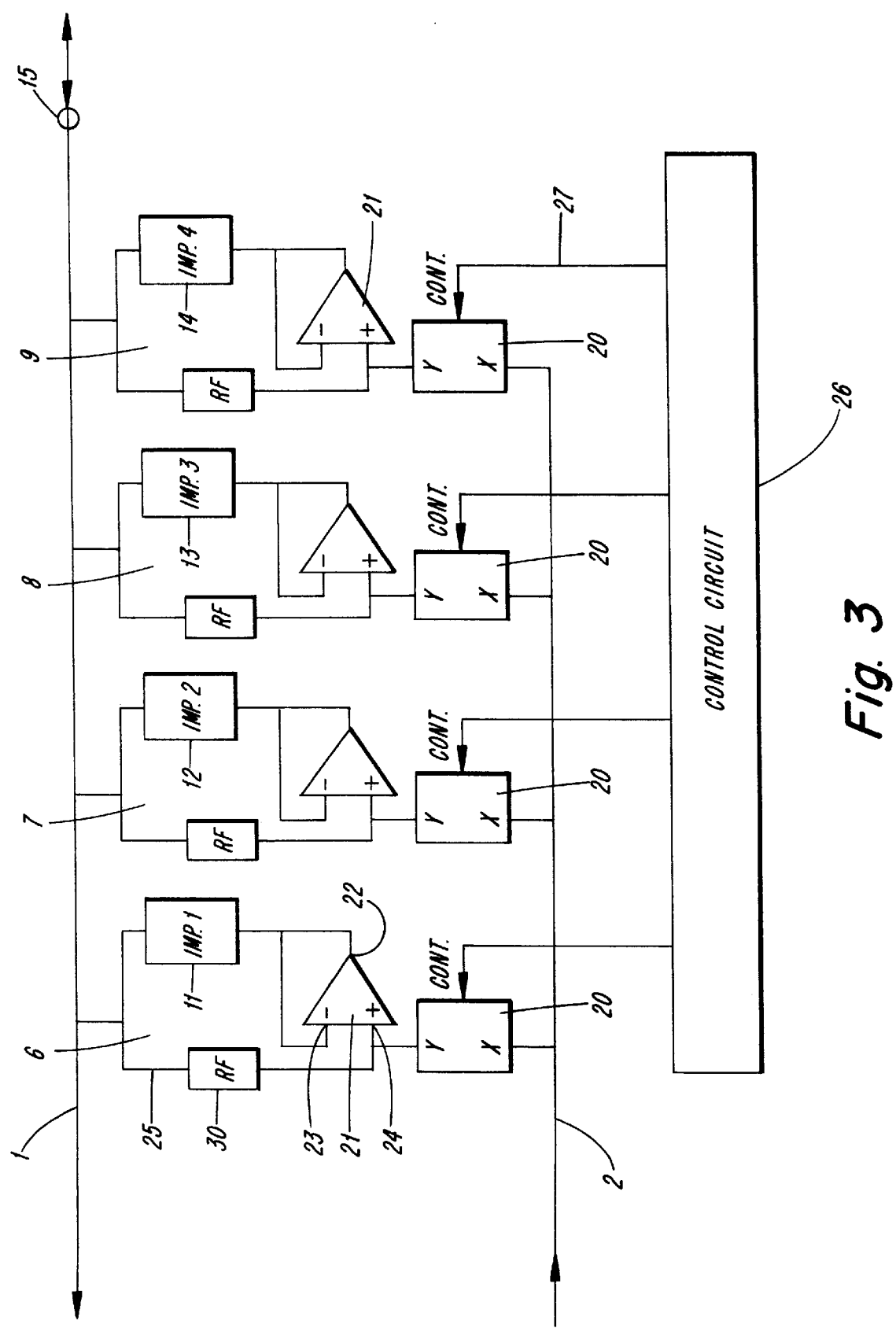
FIG. 3 discloses schematically one further embodiment of the present invention.

FIG. 3 discloses an alternative embodiment of a two-way signal path, according to which four impedance nets 6 to 9 are provided with further resistance nets 30. Each further resistance net 30 is positioned between a terminating point 15 and the non-inverting input 24 of an operational amplifier 21. By this means it is possible to use other type of multiplexers than the analogue two-pole switches, as was shown in FIG. 1. The multiplexers 20 of FIG. 3 are of so called voltage controlled type, wherein the arrangement is such that a connection between poles X and Y exists, if the multiplexer is supplied with predetermined voltage by the control circuit 26. If no voltage is supplied from circuit 26, the poles X and Y will be disconnected from each other. Suitable multiplexers may, for example, be of type 74HC4066 or similar.

Figure 4:
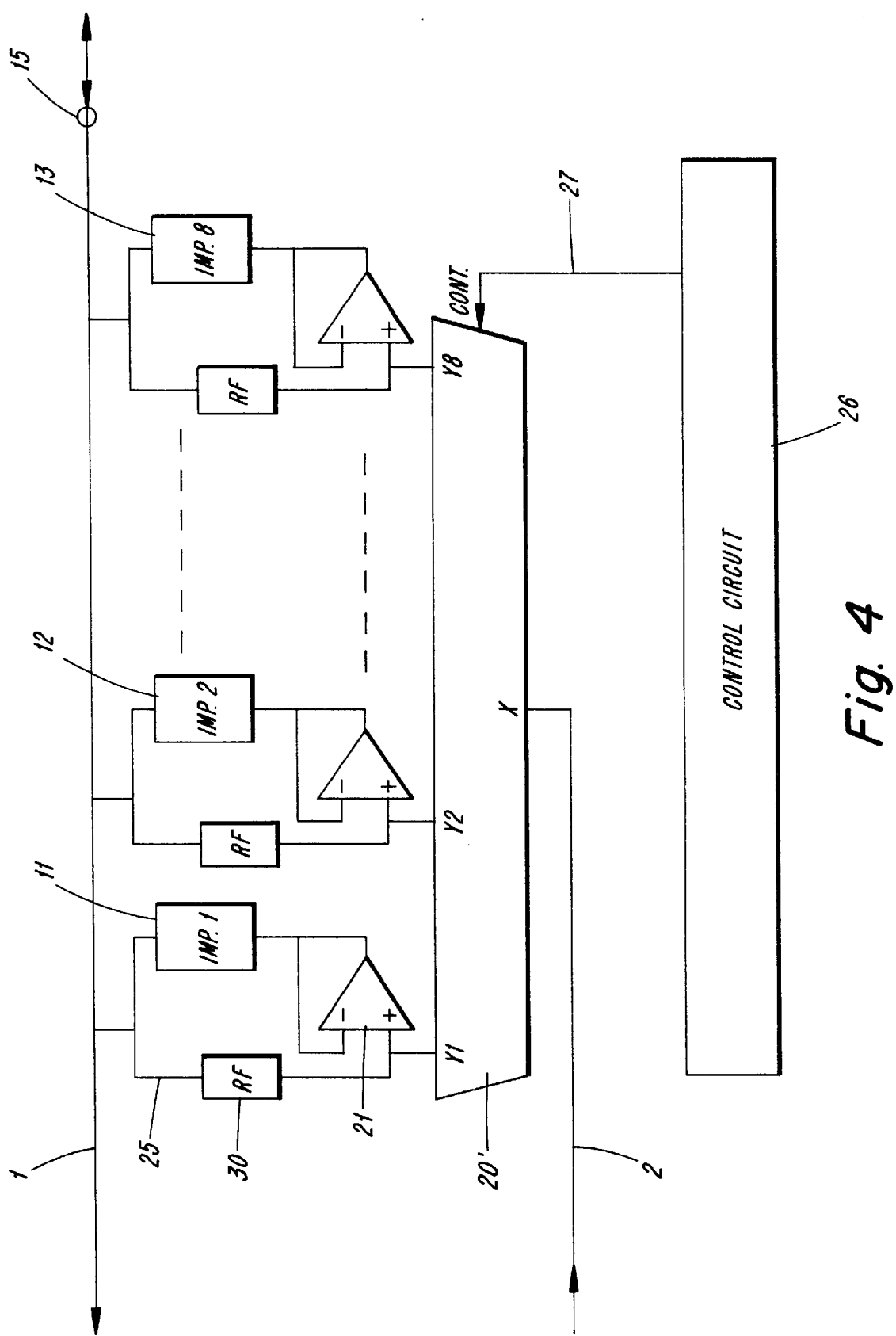
FIG. 4 discloses schematically one alternative embodiment of the present invention.

FIG. 4 discloses one further embodiment for a two-way signal path, according which only one common multiplexer 20' having eight outputs Y1 to Y8 is used for the circuitry. Said single multiplexer 20' is adapted to connect one impedance circuit having a preferred impedance amongst a group of eight possible impedance circuits 11 to 13 to the input line 2 and to disconnect the other impedance circuits from the input line 2.

A suitable multiplexer for the embodiment of FIG. 4 may, for example, be of type 74HC4051 or similar. The control signal in these is given by bits. For example, a bit series having three digits (zeros and ones) can control eight different possibilities for the connection.

Figure 5:
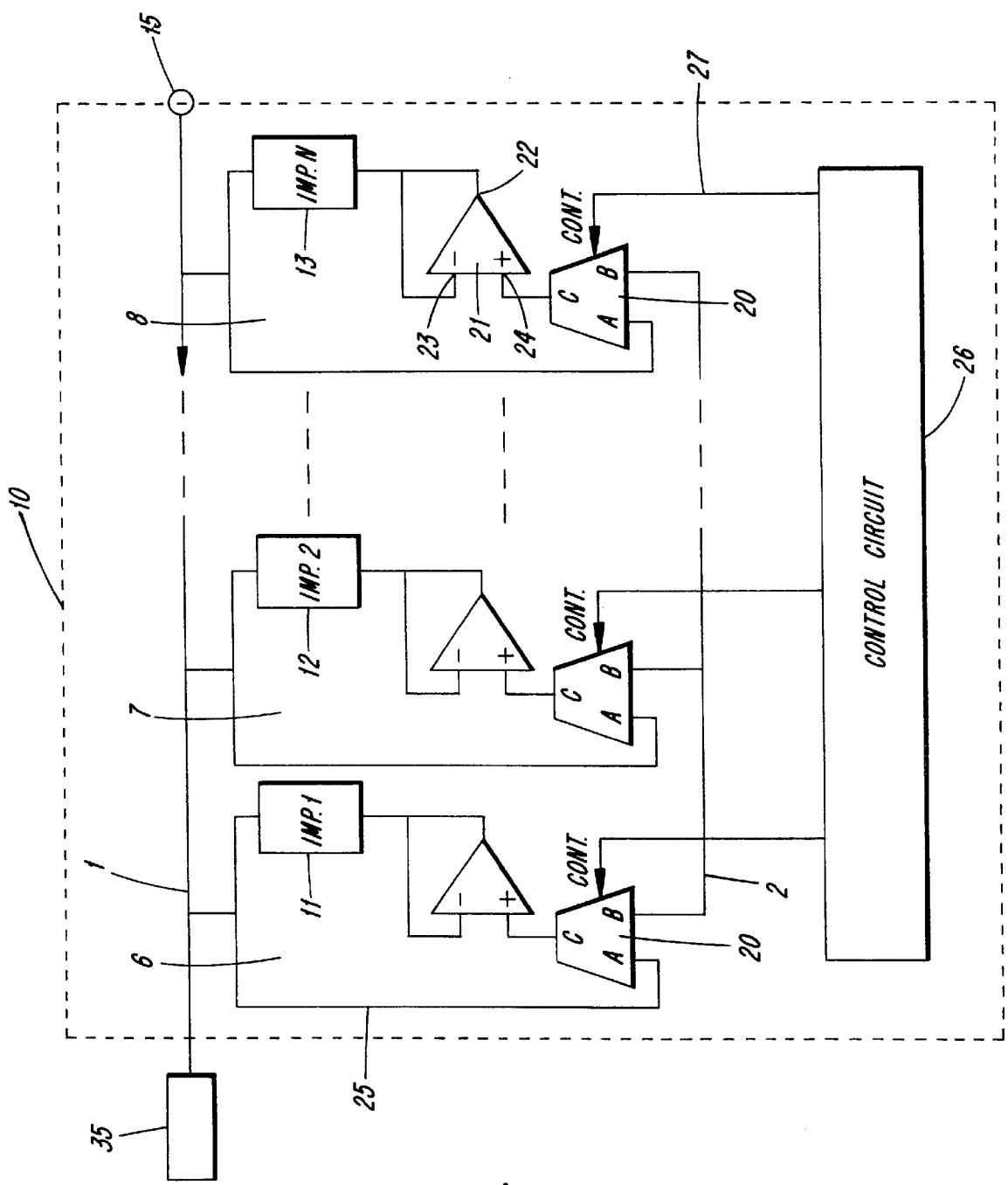
FIGS. 5, 6 and 7 show some further applications of the present invention.

FIG. 5 shows an application in which the circuitry 10 according to the present invention is used in a lever meter 35 of metering apparatus used for metering the voltage level (or power level, disturbance level etc.) of an input signal. The impedance circuits 6 to 8 are similar to those of FIG. 1. The circuitry 10 is provided in the input 15 for adapting the input impedance by a suitable one of the impedance circuits 6 to 8. Since the impedance is used only as an input impedance, the signal moves only to the 'in'direction at the terminating point 15, as designated by an arrow head.

Figure 6:
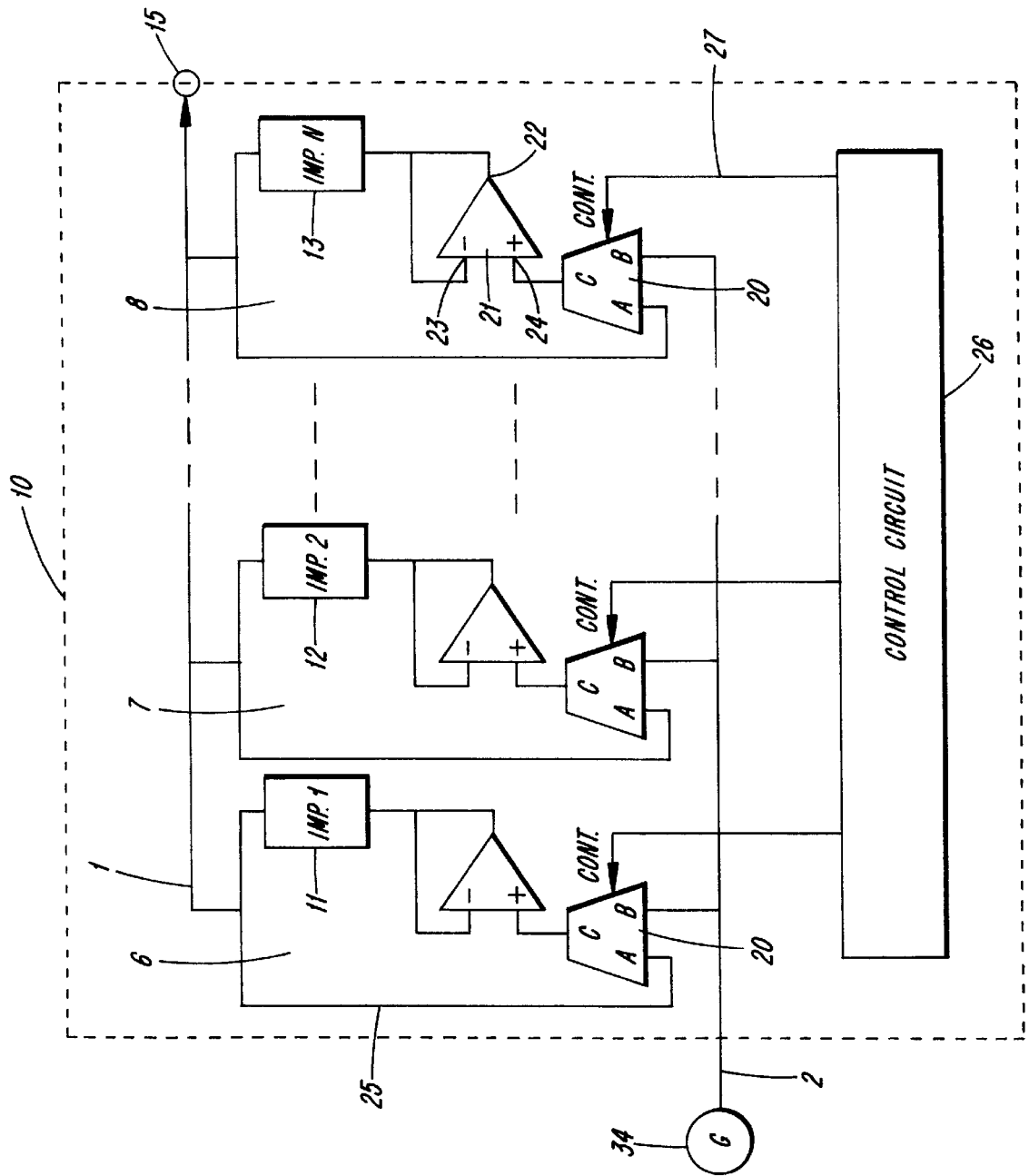

FIG. 6 shows an application in which the impedance is used as an output impedance. This kind of use is common in generators, such as 34, generating an output signal in a certain impedance level. Thus the signal moves only in the 'out'direction at the terminating point 15, as designated by an arrow head.

Figure 7:
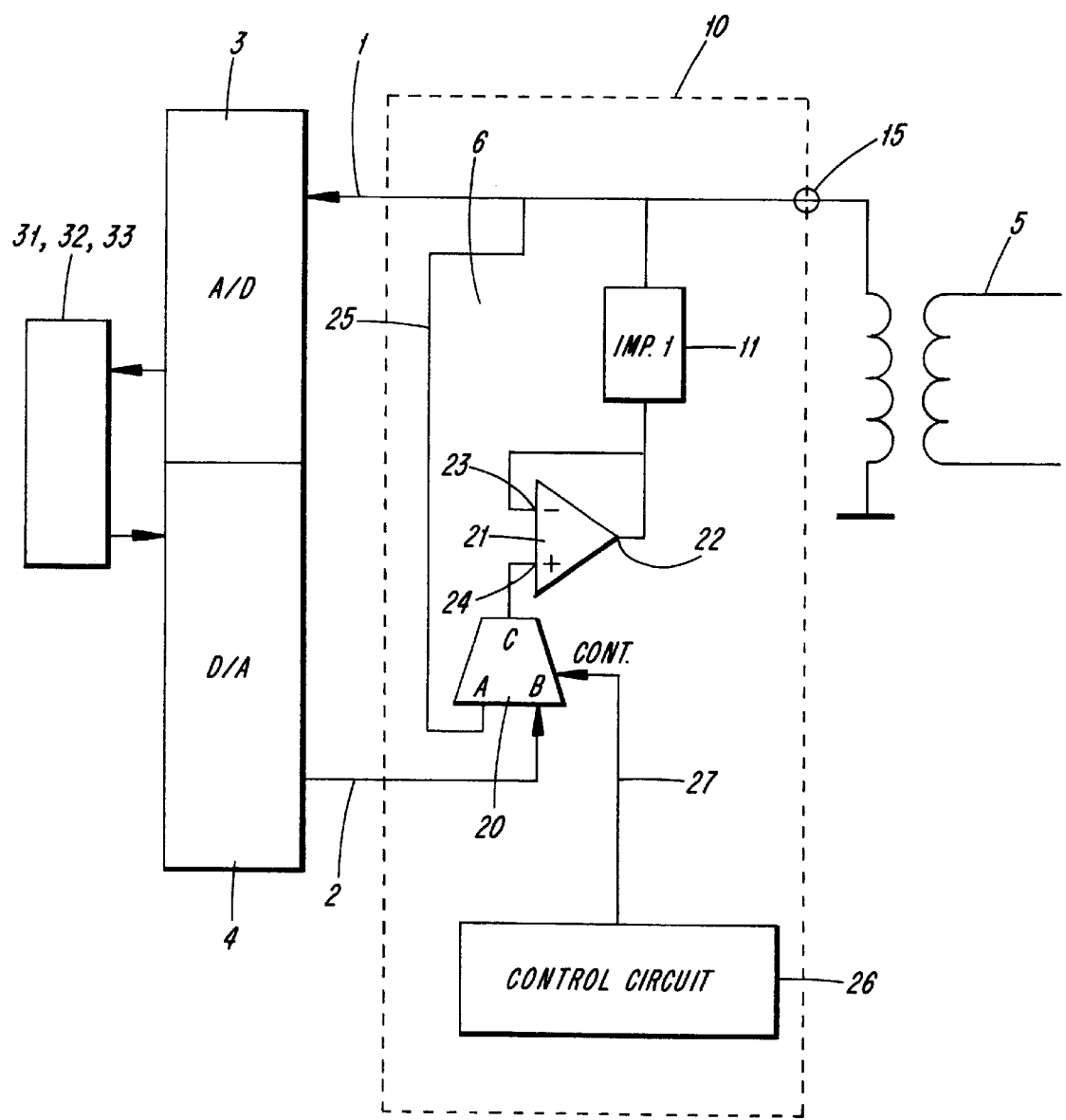

FIG. 7 shows an application in which the impedance is used as a terminating impedance, and is thus in this sense similar to FIGS. 1, 3 and 4. The signal moves in both directions, i.e. in and out, at the terminating point 15. This kind of use is, fore instance, common in telecommunication devices in which the users may speak and listen simultaneously and in fax machines 31, modems 32, digital exchanges 33 and similar. The circuitry 10 according to the invention may be a part of a trunk line unit, which may, in turn, be provided in a telephone switch.

When using the inventive circuitry 10 described above, a suitable impedance corresponding to the terminating impedance can be selected by means of the multiplexer means 20 as described above. Each multiplexer connects or disconnects the respective impedance circuit according to predetermined instructions. The multiplexer means can be controlled by suitable control means 26, such as microprocessor or other programmable means. The control means are capable of storing information about various markets and/or requirements set for impedances, and to operate correspondingly.

Thus, the invention provides an apparatus and a method by which a significant improvement can be achieved in the area of matching the impedance for various markets. The arrangement according to the present invention is easy and economical to realize by per se known components and reliable in use. It should be noted that the foregoing examples of the embodiments of the invention are not intended to restrict the scope of the invention defined in the appended claims. All additional embodiments, modifications and applications obvious to those skilled in the art are thus included within the spirit and scope of the invention as set forth by the claims appended hereto.

What is claimed is:

1. A line circuit for matching impedance in order to have a certain impedance to a signal path, said circuit comprising
a first line, a second line, a terminating point in said first line, at least one impedance determining circuit connected between said lines, said at least one impedance circuit including at least one operational amplifier, at least one multiplexer controllable by a control unit and at least one impedance net,
the connection of said at least one impedance circuit being arranged such that an output of the operational amplifier is connected to an inverting input thereof, said impedance net being connected between the output of said amplifier and said terminating point of the line circuit, the arrangement being such that a non-inverting input of the operational amplifier is connectable by at least one respective multiplexer either to the terminating point or to said second line.

2. Line circuit according to claim 1, wherein said at least one multiplexer provides connection between said second line and a non-inverting input of the operational amplifier and at least one multiplexer provides also connection between the termination point and the non-inverting input of the operational amplifier, the arrangement being such that at least one impedance circuit is in an active state and at least one impedance circuit is in a non-active state.

3. Line circuit according to claim 1, wherein the impedance net comprises at least one resistor.

4. Line circuit according to claim 1, wherein the impedance net comprises at least one circuit provided with a capacitor.

5. Line circuit according to claim 1, wherein said terminating point is connected to the non-inverting input of the amplifier through the impedance net.

6. Line circuit according to claim 1, wherein said terminating point is connected to the non-inverting input of the amplifier through a wire.

7. Line circuit according to claim 1, wherein the impedance net is connected between said terminating point and said inverting input of said operational amplifier, a further resistance net is provided between said terminating point and non-inverting input of the operational amplifier, said output of the operational amplifier being connected to said inverting input of the operational amplifier.

8. Line circuit according to claim 1, wherein the impedance net is connected between said terminating point and said inverting input of said operational amplifier, a further resistance net is provided between said terminating point and non-inverting input of the operational amplifier, said output of the operational amplifier being connected to said inverting input of the operational amplifier, wherein the line circuit is provided further with one single multiplexer adapted to connect one impedance circuit having a predetermined impedance amongst a group of impedance circuits to said second line and to disconnect the other impedance circuits from said second line.

9. Line circuit according to claim 1, wherein the second line is connected to a D/A converter from the other end thereof, and said first line is connected to a A/D converter from the one end thereof and to a transformer from the other end thereof.

10. Line circuit according to claim 1, wherein the line circuit is used in telecommunication equipment.

11. Line circuit according to claim 1, wherein the line circuit is used in measuring equipment.

12. Line circuit according to claim 1, wherein the line circuit is used in measuring devices for controlling.

13. Line circuit according to claim 1, wherein said at least one multiplexer is adapted to be software controllable by a control unit comprising CPU, memory and I/O devices.

14. A method for matching impedance in a line circuit in order to have certain impedance to a signal path, said circuit comprising a first line, a second line, a terminating point in said first line, at least one impedance determining circuit connected between said lines, said impedance circuit including at least one operational amplifier, at least one multiplexer and at least one impedance net, the method comprising the steps of connecting said at least one impedance circuit such that an output of the operational amplifier will become connected to an inverting input thereof, connecting the impedance net between the output of said amplifier and said terminating point, connecting a non-inverting input of said operational amplifier by a respective multiplexer either to said terminating point or to said second line.

15. A method according to claim 14, wherein it further comprises a step of activating at least one impedance circuit by connecting said second line and a non-inverting input of the operational amplifier by said at least one multiplexer and deactivating at least one impedance circuit by connecting said termination point and said non-inverting input of said operational amplifier by at least one multiplexer.

16. A method according to claim 14, wherein it further comprises a step of controlling said at least one multiplexer by a programmable control unit.

17. A line circuit for matching impedance in order to have a certain impedance to a signal path, said circuit comprising
a line, at least one impedance determining circuit connected to said line, said at least one impedance circuit including at least one operational amplifier and at least one multiplexer controllable by a control unit and at least one impedance net,
the connection of said at least one impedance circuit being arranged such that an output of the operational amplifier is connected to an inverting input thereof, said impedance net being connected between the output of said amplifier and said line, the arrangement being such that a non-inverting input of the operational amplifier is connectable by at least one respective multiplexer to said line.

18. Line circuit according to claim 17, wherein the impedance net comprises at least one resistor.

19. Line circuit according to claim 17, wherein the impedance net comprises at least one circuit provided with a capacitor.

20. Line circuit according to claim 17, wherein said at least one multiplexer is adapted to be software controllable by a control unit comprising CPU, memory and I/O devices.

21. A method for matching impedance in a line circuit in order to have a certain impedance to a signal path, said circuit comprising a line, at least one impedance determining circuit connected to said line, said at least one impedance circuit including at least one operational amplifier and at least one multiplexer controllable by a control unit and at least one impedance net, the method comprising the steps of connecting said at least one impedance circuit such that an output of the operational amplifier will become connected to an inverting input thereof, connecting the impedance net between the output of said amplifier and said line, connecting a non-inverting input of the operational amplifier by a respective multiplexer to said line.

22. A method according to claim 21, wherein it further comprises a step of activating at least one impedance circuit by connecting said second line and a non-inverting input of the operational amplifier by said at least one multiplexer and deactivating at least one impedance circuit by connecting said line and said non-inverting input of said operational amplifier by at least one multiplexer.

23. A method according to claim 21, wherein it further comprises a step of controlling said at least one multiplexer by a programmable control unit.

* * * * *